United States Patent
Wiita et al.

(10) Patent No.: US 11,023,317 B2
(45) Date of Patent: Jun. 1, 2021

(54) READ RECOVERY CONTROL CIRCUITRY

(71) Applicant: Micron Technology, Inc., Boise, ID (US)

(72) Inventors: Richard D. Wiita, Wyoming, MN (US); Edward C. McGlaughlin, Minneapolis, MN (US); Gary J. Lucas, Somerset, WI (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 16/510,204

(22) Filed: Jul. 12, 2019

(65) Prior Publication Data

US 2021/0011804 A1   Jan. 14, 2021

(51) Int. Cl.
*H03M 13/00* (2006.01)
*G06F 11/10* (2006.01)
*G06F 11/14* (2006.01)
*G11C 16/04* (2006.01)

(52) U.S. Cl.
CPC ...... *G06F 11/1072* (2013.01); *G06F 11/1012* (2013.01); *G06F 11/1044* (2013.01); *G06F 11/1402* (2013.01); *G11C 16/0483* (2013.01)

(58) Field of Classification Search
None
See application file for complete search history.

(56) References Cited

U.S. PATENT DOCUMENTS

| | | |
|---|---|---|
| 8,381,066 B2 | 2/2013 | Yamaga |
| 9,152,495 B2 | 10/2015 | Losh et al. |
| 9,785,501 B2 | 10/2017 | Alrod et al. |
| 2014/0149826 A1* | 5/2014 | Lu .......................... G06F 11/108 714/764 |
| 2016/0306694 A1* | 10/2016 | Tai .................... H03M 13/6325 |
| 2017/0004040 A1 | 1/2017 | Chinnakkonda et al. |
| 2018/0061498 A1* | 3/2018 | Hazama ................... G06F 3/061 |
| 2018/0091172 A1* | 3/2018 | Ilani .................... G06F 11/1012 |
| 2018/0175889 A1* | 6/2018 | Bazarsky ........... H03M 13/6325 |
| 2019/0050283 A1* | 2/2019 | Durham ................ G06F 3/0659 |
| 2020/0285550 A1* | 9/2020 | Vrabel .................... G06F 11/08 |

FOREIGN PATENT DOCUMENTS

WO   2011159806   12/2011

* cited by examiner

*Primary Examiner* — Guerrier Merant
(74) *Attorney, Agent, or Firm* — Brooks, Cameron & Huebsch, PLLC

(57) ABSTRACT

An apparatus includes an error correction component coupled to read recovery control circuitry. The error correction component can be configured to perform one or more initial error correction operations on codewords contained within a managed unit received thereto. The read recovery control circuitry can be configured to receive the error corrected codewords from the error correction component and determine whether codewords among the error corrected codewords contain an uncorrectable error. The read recovery control circuitry can be further configured to determine that a redundant array of independent disks (RAID) codeword included in the plurality of error corrected codewords contains the uncorrectable error, request that codewords among the error corrected codewords that contain the uncorrectable error are rewritten in response to the determination, and cause the plurality of error corrected codewords to be transferred to a host coupleable to the read recovery control circuitry.

20 Claims, 7 Drawing Sheets

READ RECOVERY CONTROL CIRCUITRY

TECHNICAL FIELD

Embodiments of the disclosure relate generally to memory sub-systems, and more specifically, relate to read recovery control circuitry.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIGS. 5-1, 5-2, and 5-3 are a flow diagram corresponding to read recovery control circuitry in accordance with some embodiments of the present disclosure.

DETAILED DESCRIPTION

Figure 1:
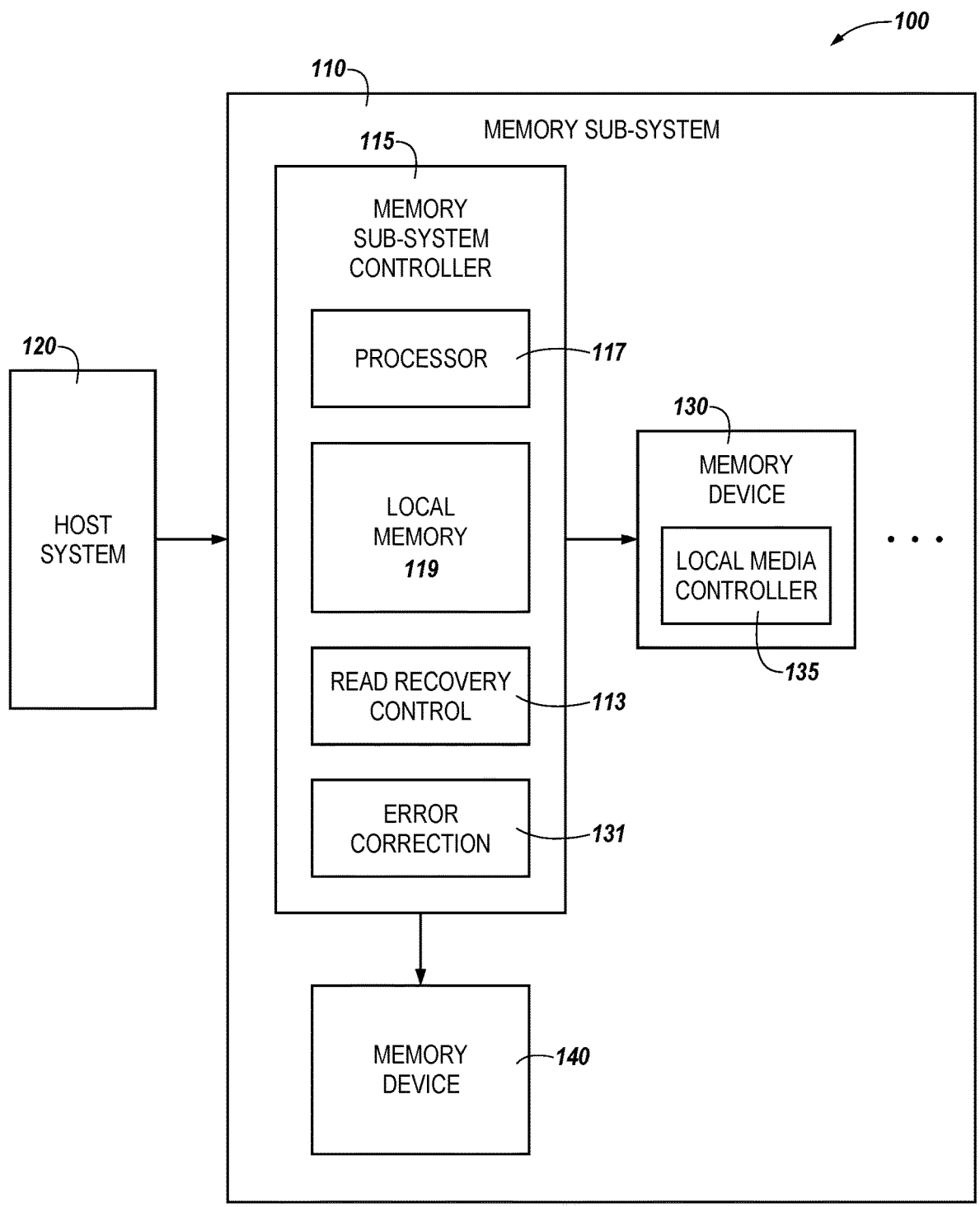
FIG. 1 illustrates an example computing environment that includes a memory sub-system in accordance with some embodiments of the present disclosure.

Aspects of the present disclosure are directed to memory sub-systems that include read recovery control circuitry. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

Memory sub-systems (e.g., SSDs) can include various control circuitry, which can employ an error detection and/or error checking technique such as a cyclic redundancy check (CRC) and/or correction code (ECC) to detect and/or correct bit errors in data (e.g., cells having incorrect states). In some conventional approaches, error correction capabilities can be provided to the memory sub-system to carry out various error checking and/or error correcting techniques. For example, an error correction component can be included in a memory sub-system to execute various ECC codes to mitigate and/or attempt to correct bit errors in data associated with the memory sub-system. The ECC codes can be associated with groups of memory cells, such as a managed unit of the memory sub-system, and can reduce read failures by detecting and possibly correcting bit errors. Examples of ECC codes include Hamming codes, Reed-Solomon (RS) codes, Low Density Parity Check (LDPC) codes, Bose-Chaudhuri-Hochquenghem (BCH) codes, circular redundancy check (CRC) codes, Golay codes, Reed-Muller codes, Goppa codes, and Denniston codes, among others.

As used herein, a "managed unit" (MU) generally refers to a number of memory cells that are programmed and/or read together or as a functional group. A managed unit may correspond to a logical block size (e.g., a data transfer size of a host and/or a data management size of a memory system), which can be, for example, 4 KB. As an example, a managed unit can be mapped to a physical block of memory cells. However, embodiments are not so limited. For example, a managed unit may correspond to more than a logical block size when a group of memory cells storing user data and overhead data (e.g., data informative of other data stored within the group of memory cells) corresponds to more than a logical block size. As an example, the overhead data may include data such as metadata, error correction code (ECC) data, logical block addresses (LBA) data as well as counters (e.g., read/write counters) associated with memory operations performed on a managed unit. In some embodiments, a MU can include multiple codewords. As used herein, a "codeword" generally refers to an element of an error correcting code. A codeword can, in some embodiments, be an independently encoded data block that is protected with a CRC.

Read failures occur when accessed data bits (e.g., memory cells representing information retrieved by a processor) have incorrect states. Reducing read failures increases the operational reliability of memory sub-systems. However, error checking/correcting techniques may not be able to correct more than a threshold number of erroneous bits. Furthermore, many error checking techniques may not even be able to detect more than a particular number of erroneous bits for a given group of cells, such as a managed unit, a codeword, or data sector.

As the size and quantity of data stored by a memory sub-system increases, the quantity of erroneous bits in data (e.g., a managed unit, a group of cells, a block, or sector of the memory sub-system) stored by the memory sub-system can increase as well. As the number of erroneous bits increases, more time and/or processing resources can be consumed in detecting and correcting the erroneous bits. For example, in some approaches, doubling the number of erroneous bits can approximately double the amount of time needed to decode the data and extract the correct data. Further, in some approaches, doubling the number of erroneous bits can increase the amount of processing resources used in decoding the data to extract the correct data.

In addition, process variability in memory device manufacture can lead to negative impacts on the lifetime of memory devices. For example, process variability can lead to memory sub-systems that can incur additional erroneous bits over a given lifetime than other similar memory sub-systems. As process technology trends toward smaller memory cells, the effects of process variability can become even more pronounced. In order to account for the effects of process variability and the effects of increasingly smaller memory cells on process variability, the strength demanded of error correction for memory sub-systems can increase, which can, in some approaches, lead to a loss of data throughput for the memory device.

In embodiments described herein, a memory sub-system can include read recovery control circuitry, which can be used to carry out various error detection and/or error correcting techniques subsequent to error detection and/or error correction operations performed by an error correction component. As described in more detail, herein, utilization of the read recovery control circuitry can address deficiencies inherent in approaches that rely solely on an error correction component to perform error checking and/or error correcting techniques.

For example, as described in more detail herein, read recovery control circuitry can perform data recovery operations on data (e.g., codewords) that contain bit errors, such as bit flip errors, uncorrectable errors, etc. to recover data that can be otherwise unrecoverable in some approaches. In some embodiments, the data can be part of a managed unit (MU) provided to the read recovery control circuitry after initial error correction operations have been performed on the data by an error correction component. The read recovery control circuitry can determine a quantity and/or a type of error(s) present in the data after the error correction component has performed an initial error correction operation on the data and can determine whether data recovery operations could be performed on the data to enhance the reliability of the data. Examples of data recovery operations that can be facilitated by the read recovery control circuitry can include redundant array of independent disk (RAID) recovery and/or recovery using different discrete read voltages (e.g., VDM retry recovery), among other recovery operations. As used herein, a "discrete read voltage" or "VDM" generally refers to a demarcation voltage which may be applied across the terminals of a memory cell when sensing the state of a memory cell. The state of the memory cell may be sensed based on the reaction of the memory cell to the applied discrete read voltage. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, the read recovery control circuitry can provide multiple tiers of programmable recovery operations to facilitate recovery of the data based on information contained in recovery stage register fields accessible to the read recovery control circuitry. In a non-limiting example, the read recovery control circuitry can access up to twelve separately programmable recovery stage register fields that control up to twelve additional data recovery attempts. It will be appreciated that embodiments herein are not limited to any particular number of recovery stage register fields or additional data recovery attempts, and greater than twelve such register fields or data recovery attempts, as well as fewer than twelve such register fields or data recovery attempts are contemplated by the disclosure.

The read recovery control circuitry can access the information stored in the recovery stage register fields to adaptively perform error detection and/or error correction on codewords of a managed unit of data based on characteristics of the memory sub-system. For example, the read recovery control circuitry can, based on the information contained in the recovery stage register fields, alter a type of error detection or error correction applied to the managed unit based on a lifecycle stage of the memory sub-system, wear leveling parameters of the memory sub-system, or other suitable parameters that can affect the performance of the memory sub-system over time.

In some embodiments, the read recovery control circuitry can also control writing back of corrected data to memory components of the memory sub-system based on characteristics of the corrected data. For example, the read recovery control circuitry can control writing back of corrected data based on a bit flip count threshold of the corrected data. Such data write backs can be referred to as "on demand scrubs," and can include a single forced write of the data, a toggle forced write of the data, etc.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, internet-of-things enabled device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

The memory sub-system 110 includes a read recovery control component 113 that can be configured to provide read data recovery to one or more codewords of a managed unit (MU) that exhibit bit flip errors and/or uncorrectable errors subsequent to performance of error correction operations on the MU by the error correction component 131. Although not shown in FIG. 1 so as to not obfuscate the drawings, the read recovery control component 113 can include various circuitry to facilitate read data recovery on the codewords and/or MU. For example, the read recovery control component 113 can include a special purpose circuitry in the form of an ASIC, FPGA, state machine, and/or other logic circuitry that can allow the read recovery control component 113 to provide read data recovery to codewords of a MU that include bit flip errors and/or uncorrectable errors after error correction operations have been performed on the codewords and/or MU by the error correction component 131.

As shown in FIG. 1, the memory sub-system 110 further includes an error correction component 131. The error correction component 131 can include circuitry and/or can execute instructions to perform error correction operations on data (e.g., codewords of a MU) that are retrieved from the memory device 130. The error correction operations can include execution of various error correcting codes (e.g., BCH, LDPC, etc.) to reduce or eliminate bit errors in the data retrieved from the memory device 140. However, performance of error correction operations using the error correction component 131 may fail to correct every error present in the data. For example, uncorrectable errors and/or residual bit flip errors may be present in the data subsequent to performance of the error correction operations by the error correction component 131.

As described in more detail in connection with FIG. 2, the data can be transferred to the read recovery control circuitry 113 and/or to a collection buffer (e.g., the collection buffer 214 illustrated in FIG. 2) subsequent to performance of the error correction operations by the error correction component 131. For example, in contrast to approaches in which error correction is performed on the data using an error correction component 131 and then transferred to circuitry external to the memory sub-system 110 (e.g., to a host system 120), embodiments herein allow for the error corrected data to be transferred to circuitry internal to the memory sub-system 110 for subsequent processing. Such subsequent processing can include performance of operations to determine a quantity of residual bit flip errors in the data, operations to determine a quantity of uncorrectable errors in the data, and/or operations to further mitigate or reduce the quantity of residual bit flip error and/or uncorrectable errors in the data prior to transfer of the data to circuitry external to the memory sub-system 110.

In a non-limiting example, the error correction component 131 can be configured to perform one or more initial error correction operations on codewords contained within a managed unit received thereto. Subsequent to performance of the one or more error correction operations, the read recovery control circuitry 113 can be configured to receive the error corrected codewords from the error correction component 131, determine whether codewords among the error corrected codewords contain an uncorrectable error, and/or determine that a redundant array of independent disks (RAID) codeword included in the error corrected codewords contains the uncorrectable error. In some embodiments, the read recovery control circuitry 113 can be configured to request that codewords among the error corrected codewords that contain the uncorrectable error are rewritten in response to the determination and/or cause the error corrected codewords to be transferred to the host system 120 coupleable to the read recovery control circuitry 113. For example, if the RAID codeword contains the uncorrectable error, the read recovery control circuitry 113 can determine that the other codewords of the managed unit do not contain an uncorrectable error and can transfer the managed unit to the host system 120.

Figure 3:
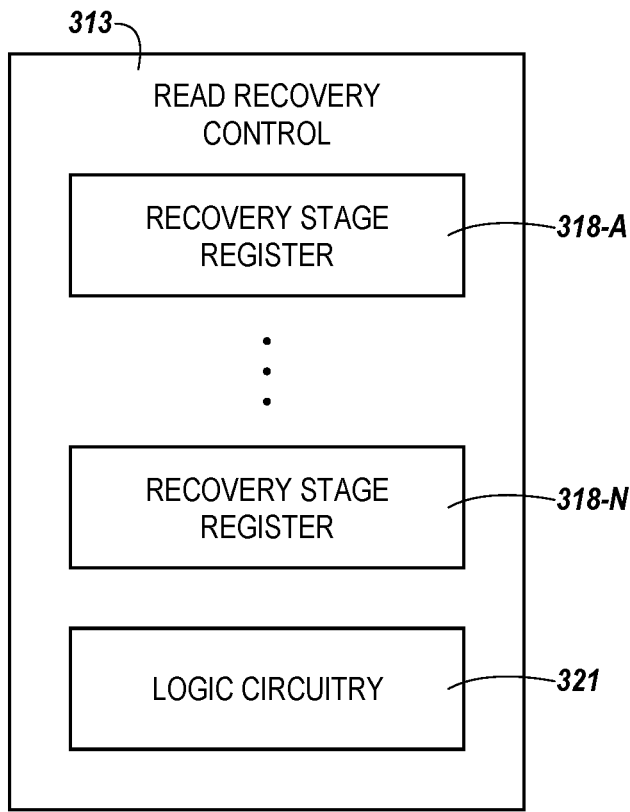
FIG. 3 illustrates an example of read recovery control circuitry in accordance with some embodiments of the present disclosure.

In some embodiments, the read recovery control circuitry 113 can be configured to request that the codewords among the error corrected codewords that contain the uncorrectable error are rewritten based, at least in part, on information contained in register fields (e.g., the recovery stage registers 318A to 318N illustrated in FIG. 3) accessible by the read recovery control circuitry 113. For example, the read recovery control circuitry 113 can be configured to request the codewords among the error corrected codewords that contain the uncorrectable error are processed by the error correction component 131 according to a particular error code based, at least in part, on a lifecycle stage of a memory device from which the error corrected codewords are retrieved. Embodiments are not so limited, however, and in some embodiments, the read recovery control circuitry 113 can be configured to cause the error correction component 131 to perform one or more error correction operations on the rewritten codewords using a different discrete read voltage than a discrete read voltage used to perform the one or more initial error correction operations.

In some embodiments, the read recovery control circuitry 113 can be configured to determine that a quantity of codewords among the error corrected codewords that contain the uncorrectable error is less than a threshold quantity of codewords that contain the uncorrectable error and/or perform a logical operation using the error corrected codewords to recover the codewords that contain the uncorrectable error. For example, if the quantity of codewords that contain the uncorrectable error is less than a threshold quantity of codewords containing an uncorrectable error, the read recovery control circuitry 113 can perform an XOR operation using codewords of the managed unit to recover the data without re-requesting the codewords in error from the memory device 140.

Once the read recovery control circuitry 113 has determined that the codewords of the managed unit do not contain uncorrectable errors (or, at minimum, contains less than an acceptable threshold quantity of uncorrectable errors), wherein the read recovery control circuitry 113 can be configured to transfer codewords among the error corrected codewords that do not contain an uncorrectable error to buffering circuitry (e.g., the collection buffer 214 illustrate in FIG. 2) coupled to the read recovery control circuitry 113 while the request to rewrite the codewords among the error corrected codewords that contain the uncorrectable error is processed.

Figure 2:
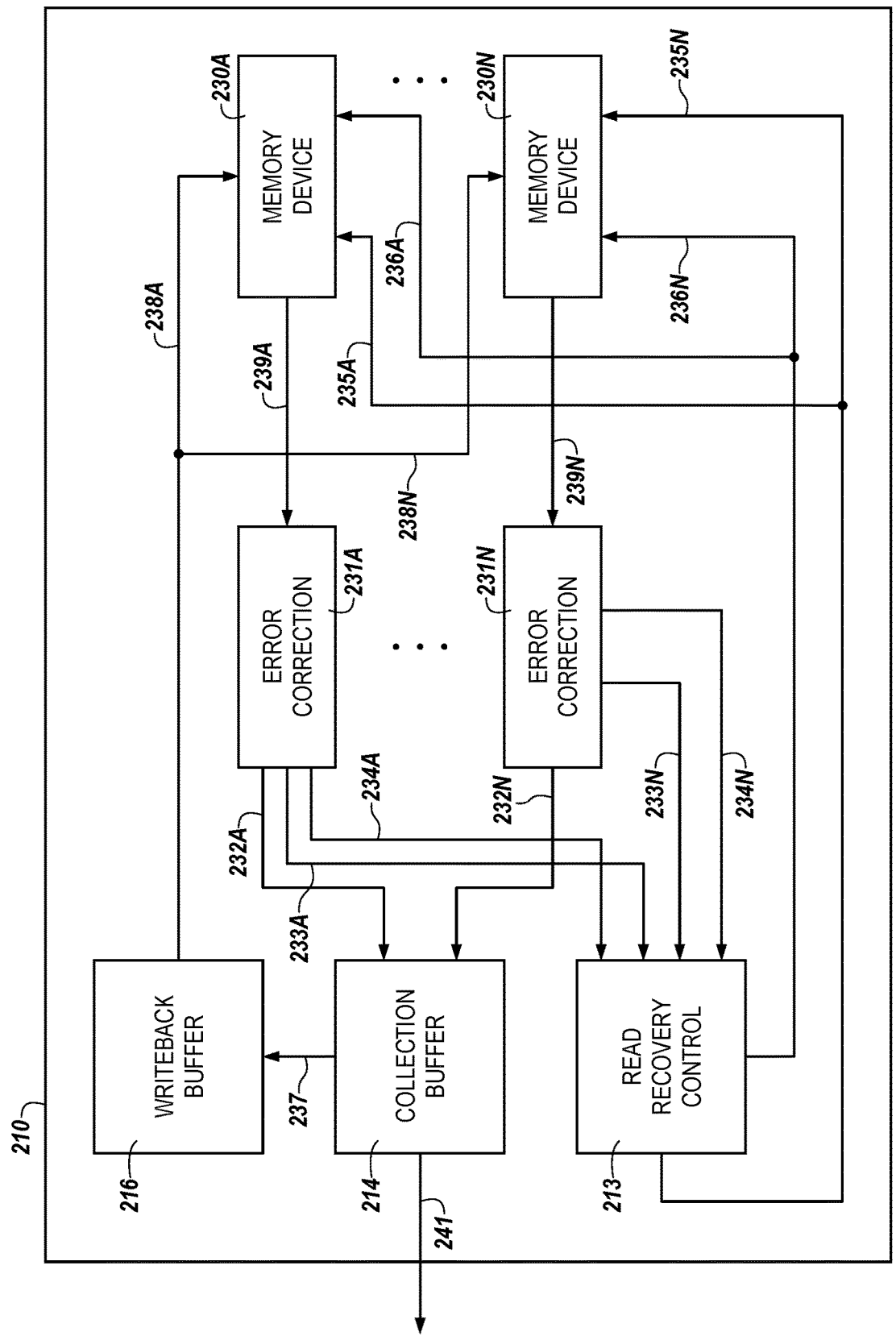
FIG. 2 illustrates an example of a portion of a memory sub-system in accordance with some embodiments of the present disclosure.

FIG. 2 illustrates an example of a portion of a memory sub-system 210 in accordance with some embodiments of the present disclosure. The memory sub-system 210 can include media, such as memory device 230A to 230N, which can be analogous to the memory device 130 illustrated in FIG. 1. In addition, the memory sub-system 210 can include error correction components 231A to 231N, which can be analogous to the error correction component 131 illustrated in FIG. 1 and read recovery control circuitry 213, which can be analogous to the read recovery control circuitry 113 illustrated in FIG. 1. As shown in FIG. 2, the memory sub-system 210 can further include a collection buffer 214 and/or a writeback buffer 216.

Data, such as a managed unit containing multiple codewords, can be transferred from the memory device 130A to 130N to the error correction components 231A to 231N, via data paths 239A to 239N. In some embodiments, a managed unit can include sixteen (16) codewords and multiple managed units can be processed in parallel such that thirty-two (32) or greater codewords can be processed in parallel by the error correction components 231A to 231N and/or the read recovery control circuitry 213. In a non-limiting example, a managed unit can include fifteen (15) codewords and one RAID codeword, however embodiments are not limited to a specific quantity of codewords per managed unit. Further, although a 1:1 correspondence between the memory devices 230A to 230N and the error correction components 231A to 231N is shown in FIG. 2, embodiments are not so limited, and embodiments in which greater than or fewer than one error correction component 231A to 231N per memory device 230A to 230N are contemplated.

As described above, error correction operations can be performed using the error correction components 231A to 231N on the data received from the memory devices 230A to 230N by the error correction components 231A to 231N. If the data does not exhibit bit flip errors and/or uncorrectable errors subsequent to performance of the error correction operations, the error corrected data can be transferred to the collection buffer 214 via the data paths 232A to 232N. If some of the error corrected data (e.g., if some codewords of the managed unit) do not contain bit flip errors and/or uncorrectable errors, the error corrected data that does not exhibit the bit flip errors and/or the uncorrectable errors can be transferred to the collection buffer 214 via the data paths 232A to 232N. In such embodiments, error corrected data that exhibits bit flip errors can be transferred to the read recovery control circuitry 213 via the data paths 233A to 233N, while error corrected data that exhibits uncorrectable errors can be transferred to the read recovery control circuit 213 via the data paths 234A to 234N. Embodiments are not so limited, however, and in some embodiments, the entire managed unit can be transferred to the read recovery control circuitry 213 via the data paths 233A to 233N and/or the data paths 234A to 234N in response to a determination that one or more of the codewords of the error corrected managed unit contains a bit flip error and/or an uncorrectable error.

Upon receipt of the error corrected data that contains bit flip errors and/or uncorrectable errors, the read recovery control circuitry 213 can perform various operations to attempt to recover the data containing the bit flip errors and/or the uncorrectable errors. For example, the read recovery control circuitry 213 can determine an applicable read recovery stage and perform operations to attempt to recover the data based on the read recovery stage, as described in more detail in connection with FIGS. 5-1, 5-2, and 5-3, herein. In some embodiments, the applicable read recovery stage can be determined based on information contained in recovery step registers (e.g., the recovery step registers 318A to 318N illustrated in FIG. 3) that are accessible to the read recovery control circuitry 213.

Based on the applicable read recovery stage, the read recovery control circuitry 213 can request that the data (e.g., one or more codewords of the MU) that, subsequent to performance of error correction operations, corresponds to data that exhibited bit flip errors and/or uncorrectable errors, be retrieved from the memory devices 230A to 230N via the data paths 235A to 235N and/or 236A to 236N and error corrected again. For example, if the read recovery control circuitry 213 determines that two codewords of the MU exhibit bit flip and/or uncorrectable errors subsequent to performance of the error correction operations by the error correction components 231A to 231N, the read recovery control circuitry 213 can request, via the data paths 235A to 235N and/or 236A to 236N, the two original codewords of the MU that exhibited bit flip errors and/or uncorrectable errors subsequent to error correction by the error correction components 231A to 231N.

In response to such a request, the requested codewords can be retrieved from the memory devices 230A to 230N and transferred to the error correction components 231A to 231N, where error correction operations can be performed. In some embodiments, the error correction components 231A to 231N can perform the error correction operations using different error correction parameters than were used in the preceding error correction operation. For example, if the data was initially error corrected using an initial discrete read voltage, on the second error correction attempt, the error correction components 231A to 231N can attempt to error correct the data using a same discrete read voltage, or a discrete read voltage that has been incremented by some voltage offset, as described in more detail in connection with FIGS. 5-1, 5-2, and 5-3, herein.

In another example, if a RAID codeword is included with the error corrected data and a single codeword is in error, the read recovery control circuitry 213 can apply RAID correction to the codeword containing the error to recover the data. If, however, the RAID codeword itself is the only codeword that contains bit flip errors and/or uncorrectable errors, the read recovery control circuitry 213 can determine that the rest of the codewords do not contain additional bit flip errors and/or uncorrectable errors and can transfer the data to the collection buffer 214 to be sent to circuitry external to the memory sub-system 210 via the data path 241, as described in more detail in connection with FIGS. 5-1, 5-2, and 5-3, herein.

Embodiments are not limited to the data being transferred to circuitry external to the memory sub-system 210, however, and in some embodiments, the data can be transferred back to the memory devices 230A to 230N once the read recovery control circuitry 213 has performed operations on the data to correct residual errors in the data subsequent to the error correction operations being performed by the error correction components 231A to 231N. For example, once the data has been stored in the collection buffer 214, the data can be transferred via the data path 237 to a writeback buffer 216. After the data has been stored in the writeback buffer 216, the data can be transferred to the memory devices 230A to 230N via the data paths 238A to 238N.

FIG. 3 illustrates an example of read recovery control circuitry 313 in accordance with some embodiments of the present disclosure. The read recovery control circuitry 313 can include recovery stage registers 318A to 318N, as well as logic circuitry 321. The logic circuitry 321 can be configured to perform the operations associated with the read recovery control circuitry 313 (e.g., request codewords to be retrieved from the memory components, determine a number of bit flip errors and/or uncorrectable errors present in the data subsequent to error correction, etc.) described herein.

The recovery stage registers 318A to 318N can store information (e.g., control fields) that can correspond to different operations to be taken by the read recovery control circuitry 313. In some embodiments, the recovery stage registers 318A to 318N can be configurable or programmable. For example, the recovery stage registers 318A to 318N can be adaptive over time such that the information contained therein alters over the course of the life of a memory sub-system in which the read recovery control circuitry 313 is deployed. The recovery stage registers 318A to 318N can be altered to account for various parameters associated with the memory sub-system, such as wear leveling parameters of the memory sub-system or a lifecycle stage of the memory sub-system, among other suitable parameters. In some embodiments, such alterations can be made "on the fly," for example, without powering cycling the memory sub-system.

Examples of the types of information that can be stored by the recovery stage registers 318A to 318N can include a total bit flip count threshold level for various discrete read voltages applied as part of an error correction operation and/or can include a bit flip count of bits that have switched from zero to one (or one to zero) for various discrete read voltages applied as part of an error correction operation. In some embodiments, the total bit flip count and/or the bit flip count of bits that have switched from zero to one, or vice versa, can be used by the read recovery control circuitry 313 to determine whether or not to initiate operations to request re-reads of codewords contained within an error corrected managed unit, or whether or not to request a re-read of the entire managed unit.

The recovery stage registers 318A to 318N can further include information related to RAID recovery codewords contained within the managed unit. For example, the recovery stage registers 318A to 318N can include information corresponding to whether or not RAID recovery is enabled or whether or not a RAID recovery codeword is included in the managed unit, among other RAID related information. Depending on whether or not RAID recovery is enabled, the read recovery control circuitry 313 can perform different operations to recover error corrected data that contains bit flip errors and/or uncorrectable errors, as described in more detail in connection with FIGS. 5-1, 5-2, and 5-3, below.

The recovery stage registers 318A to 318N can include information corresponding to a stage of the read recovery process. For example, because the read recovery process described herein can include multiple stages, the recovery stage registers 318A to 318N can keep track (e.g., by incrementing a counter) of what stage in the recovery process is currently being implemented. In a non-limiting example, the counter can be incremented upon failure of a read recovery operation and a different read recovery operation can be invoked based on the counter.

In some embodiments, the recovery stage registers 318A to 318N can include information corresponding to discrete read voltages at which the data was error corrected, as well as offset discrete read voltages that may be used for successive stages of the recovery operation. For example, the recovery stage registers 318A to 318N can include initial discrete voltage information, as well as discrete read voltage information for subsequent read recovery operations, if any are invoked. The read recovery control circuitry 313 can use this information to determine appropriate discrete read voltages to be applied for subsequent read recovery operations, should such operations be invoked.

Figure 4:
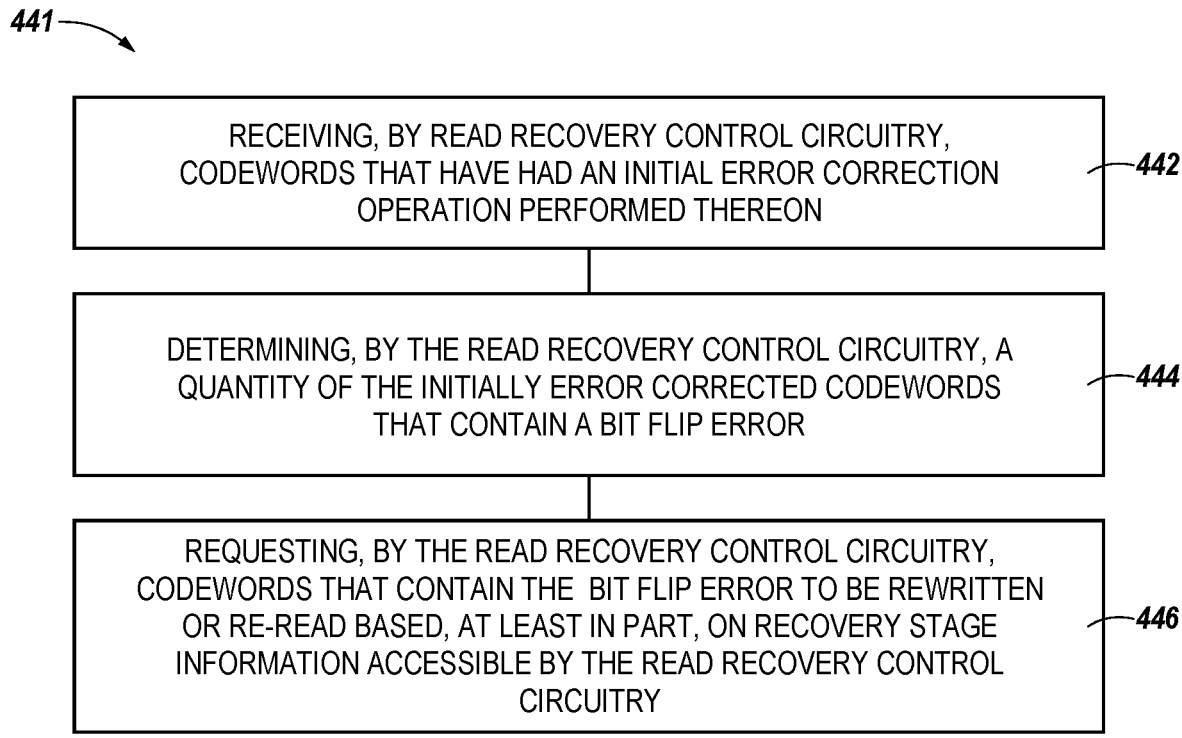
FIG. 4 is a flow diagram of an example method corresponding to read recovery control circuitry in accordance with some embodiments of the present disclosure.
Figures 1, 5:
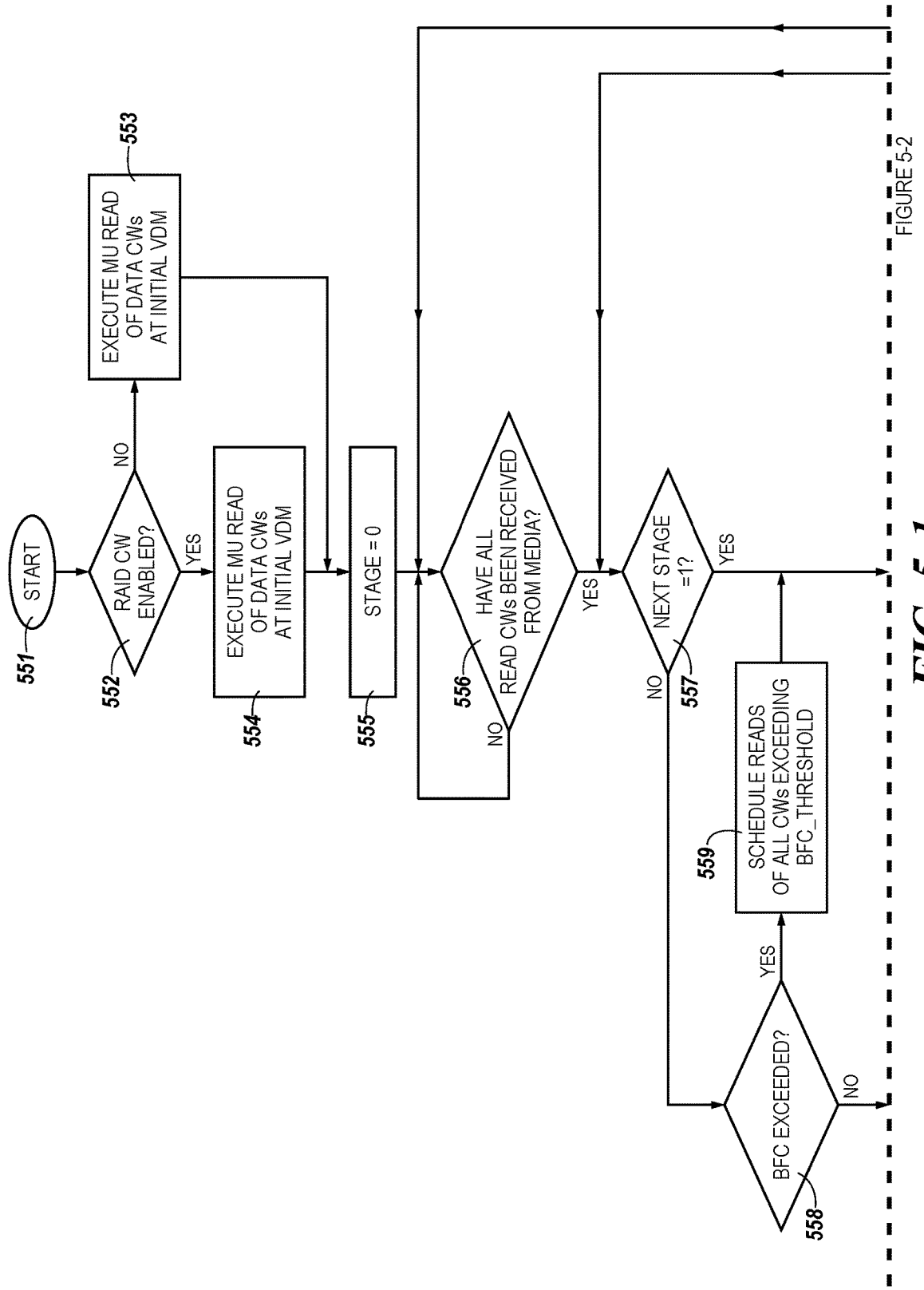
Figures 2, 5:
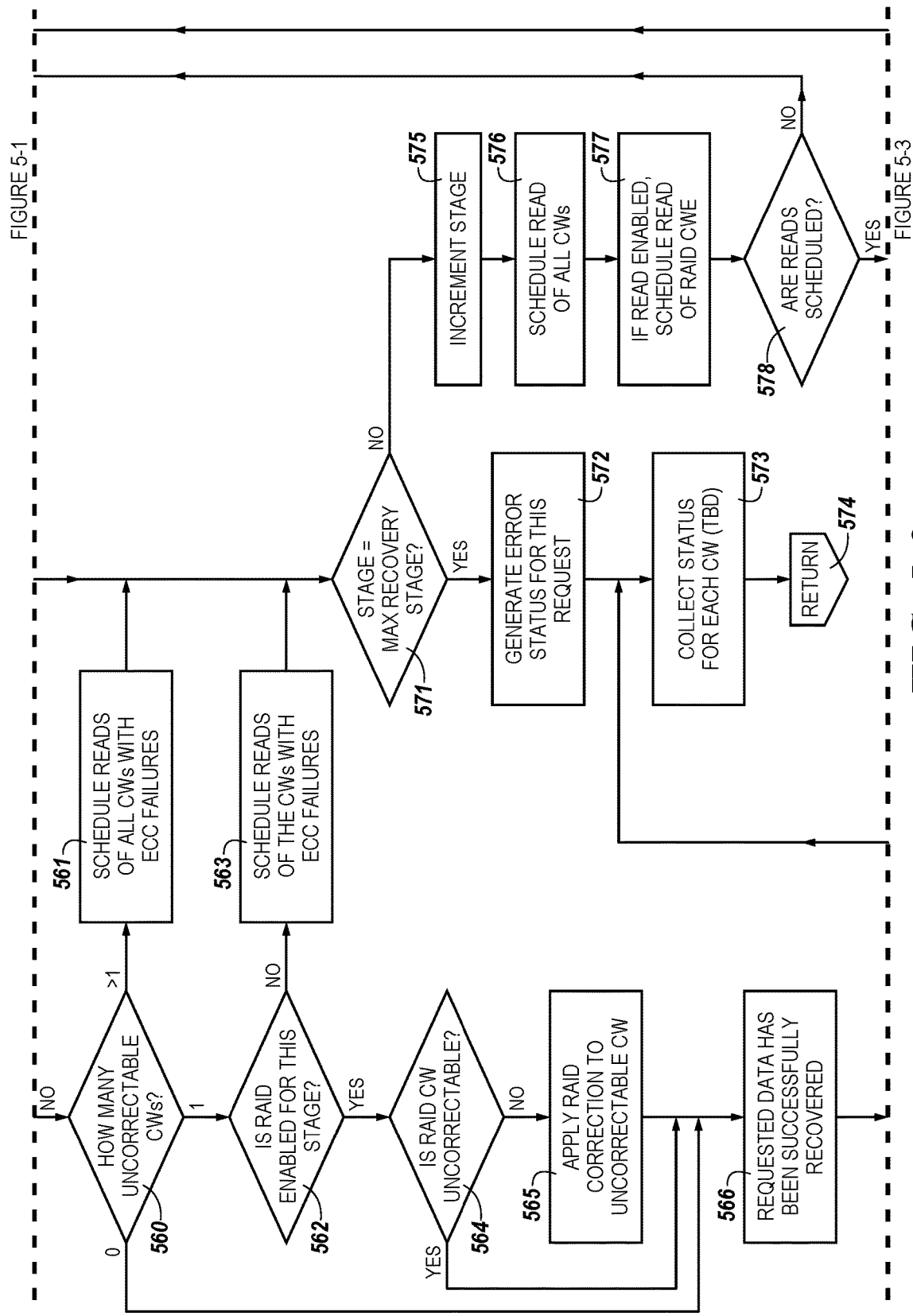
Figures 3, 5:
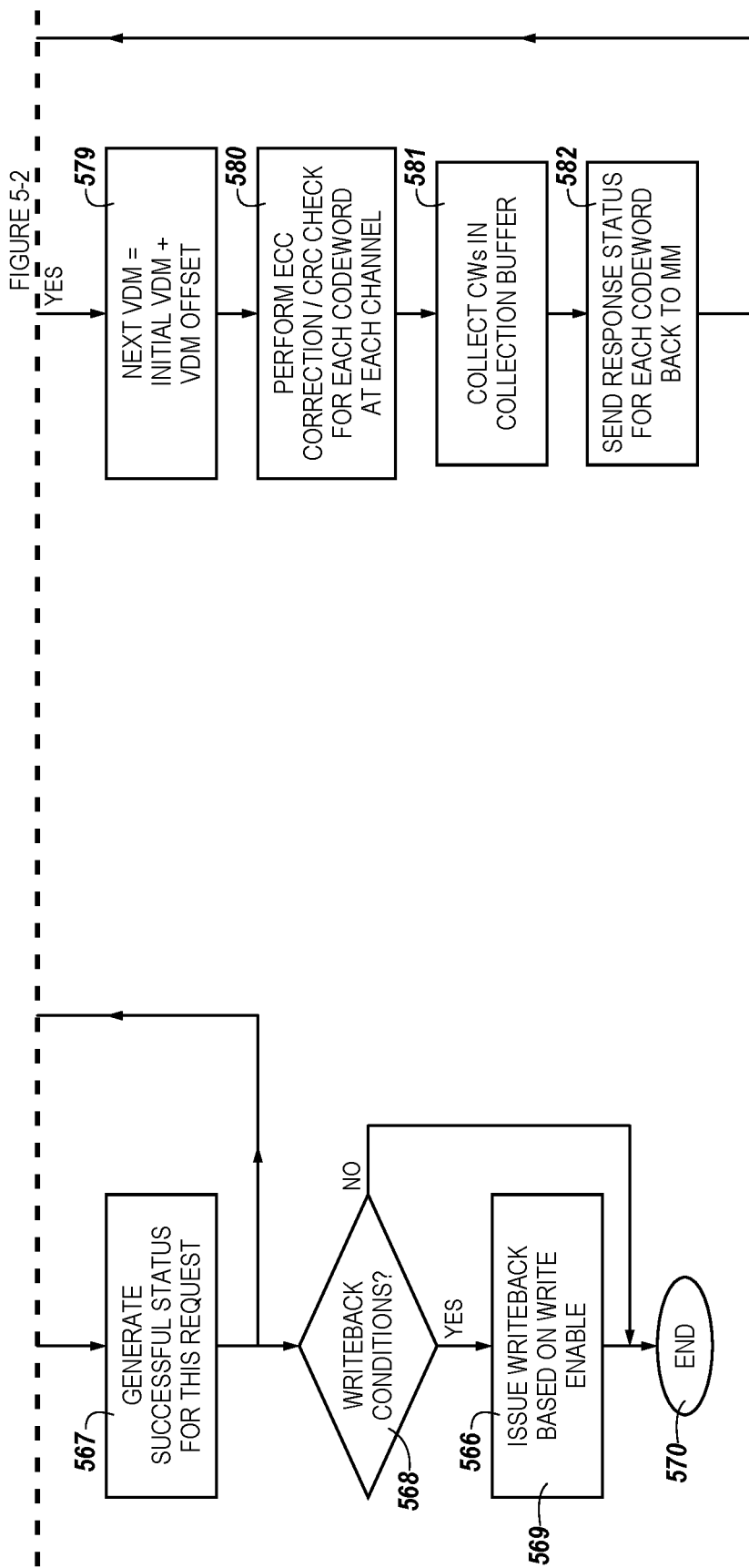

FIG. 4 is a flow diagram of an example method 441 corresponding to read recovery control circuitry in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the read recovery control circuitry 113 of FIG. 1, the read recovery control circuitry 213 of FIG. 2, and/or the read recovery control circuitry 313 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 442, the method 441 includes receiving, by read recovery control circuitry, codewords that have had an initial error correction operation performed thereon. The read recovery control circuitry can be analogous to the ready recovery control circuitry 113 illustrated in FIG. 1, the ready recovery control circuitry 213 illustrated in FIG. 2, and/or the ready recovery control circuitry 313 illustrated in FIG. 3. In some embodiments, the initial error correction operation can be performed by an error correction component, such as the error correction component 131 illustrated in FIG. 1 and/or the error correction component 231 illustrated in FIG. 2.

At block 444, the method 441 includes determining, by the read recovery control circuitry, a quantity of the initially error corrected codewords that contain a bit flip error. The quantity of initially error corrected codewords that contain the bit flip error can be used by the read recovery control circuitry to determine an applicable read recovery stage and/or to determine subsequent operations to be performed to attempt to recover the data. In some embodiments, the quantity of initially error corrected codewords can be part of a managed unit, as described above.

At block 446, the method 441 includes requesting, by the read recovery control circuitry, codewords that contain the bit flip error to be rewritten or re-read based, at least in part, on recovery stage information accessible by the read recovery control circuitry. In some embodiments, the method 441 can further include comprising requesting the codewords that contain the bit flip error to be re-read using a discrete read voltage greater than a discrete read voltage used to initially read the error corrected codewords. For example, the method 441 can include incrementing a discrete read voltage used to read the codewords from a memory device such that subsequent stages of read recovery are performed using a high level discrete read voltage or a high level threshold voltage. In some embodiments, the method 441 can include adapting, by the read recovery control circuitry, the recovery stage information over time based, at least in part, on a wear leveling status of the memory component, a lifecycle stage of the memory component, or both. The recovery stage information can be stored in recovery stage registers, such as the recovery stage registers 318A to 318N illustrated in FIG. 3, herein.

In some embodiments, the method 441 can include requesting, by the read recovery control circuitry, that the codewords that contain the at least one of the bit flip error or the uncorrectable error, are error corrected using a different error correction criteria than an error correction criteria used to perform the initial error correction operation based, at least in part, on the recovery stage information. An example of the error correction criteria can include a discrete read voltage that is used in performance of the error correction operation.

The method 441 can further include determining, by the read recovery control circuitry that a quantity of codewords among the initially error corrected codewords that contain the at least one of the bit flip error or the uncorrectable error is less than a threshold quantity of codewords that contain the at least one of the bit flip error or the uncorrectable error and/or performing a logical operation using the error corrected codewords to recover the codewords that contain the at least one of the bit flip error or the uncorrectable error. For example, it may be possible to recover the data by performing a XOR operation using the codewords contained in the data if the quantity of bit flip errors or uncorrectable errors is less than a threshold quantity of bit flip errors or uncorrectable errors. Accordingly, if the quantity of bit flip errors or uncorrectable errors is less than a threshold quantity of bit flip errors or uncorrectable errors, the read recovery control circuitry can cause a XOR operation to be performed using the codewords contained in the data to attempt to recover the data.

In some embodiments, the method 441 can include determining, by the read recovery control circuitry, that a single codeword among the initially error corrected codewords contains the at least one of the bit flip error or the uncorrectable error and/or performing a redundant array of independent disks (RAID) operation to recover the plurality of codewords. For example, if RAID recovery is enabled and a single codeword of the initially error corrected codewords contains bit flip errors and/or uncorrectable errors, the read recovery control circuitry can cause a RAID recovery operation to be performed to attempt to recover the data. In other embodiments, the method 441 can include determining, by the read recovery control circuitry, that a single codeword among the error corrected codewords contains the at least one of the bit flip error or the uncorrectable error is a RAID codeword. In this example, the read recovery control circuitry can determine that the rest of the codewords do not contain bit flip errors and/or uncorrectable errors and can transfer the error corrected codewords to circuitry external to the read recovery control circuitry.

FIGS. 5-1, 5-2, and 5-3 are a flow diagram 550 corresponding to read recovery control circuitry in accordance with some embodiments of the present disclosure. The operations described in the blocks of FIGS. 5-1, 5-2, and 5-3 can be performed using circuitry of a memory sub-system, such as the memory sub-system 110 illustrated in FIG. 1. For example, the operations described in the blocks of FIGS. 5-1, 5-2, and 5-3 can be performed using read recovery control circuitry, such as the raid recovery control circuitry 113 illustrated in FIG. 1 and/or an error correction component, such as the error correction component 131 illustrated in FIG. 1, herein.

At block 551, a read recovery operation can start. At block 552, a determination can be made as to whether or not a RAID codeword is enabled for the read recovery operation. If a RAID codeword is not enabled for the read recovery operation, at block 553, a managed unit (MU) read of data codewords (CWs) can be executed at an initial discrete read voltage. In the alternative, if a RAID codeword is enabled for the read recovery operation, at block 554, a MU read of data CWs and the RAID CW can be executed at an initial discrete read voltage.

At block 555, performance of the read recovery operation can include setting a stage of the read recovery operation to zero (e.g., to a zeroth stage of the read recovery operation). In some embodiments, the stage of the recovery operation can be stored in a recovery stage register, such as the recovery stage registers 318A to 318N illustrated in FIG. 3. At block 556, a determination can be made as to whether all the CWs read from the media (e.g., a memory component, such as the memory device 130 illustrated in FIG. 1) have been received by an error correction component (e.g., the error correction component 131 illustrated in FIG. 1) and/or by read recovery control circuitry (e.g., the read recovery control circuitry 113 illustrated in FIG. 1).

If all the CWs read from the media have been received, at block 557, a determination as to whether the stage of the read recovery operation is a first stage (e.g., a next stage subsequent to the zeroth stage) of the read recovery operation. If the stage of the read recovery operation is not yet at the first stage, at block 558, a determination can be made as to whether a bit flip count (BFC) for one or more CWs of the MU has been exceeded. In some embodiments, the determination as to whether the BFC has been exceed can be made by read recovery control circuitry based on information stored in the recovery stage register(s).

If the BFC has not been exceeded for CWs within the MU, at block 560, a determination can be made as to how many uncorrectable CWs are present in the MU. If there are no uncorrectable CWs in the MU, the read recovery operation can continue to block 566, where it is determined that the data in the MU has been successfully recovered. If a single CW is uncorrectable, at block 562, a determination as to whether RAID recovery is enabled for the current stage of recovery. If RAID recovery is enabled for the current stage of recovery, at block 564, a determination can be made as to whether the RAID CW is uncorrectable. If the RAID CW is uncorrectable, the read recovery operation can proceed to block 566, where it is determined that the data in the MU has been successfully recovered. If the RAID CW is uncorrectable, at block 565, RAID correction can be applied to the uncorrectable CW to recover the CW and the read recovery operation can proceed to block 566, where it is determined that the data in the MU has been successfully recovered.

Subsequent to determining that the data in the MU has been successfully recovered, at block 567 a successful status can be generated for the data request. If, at block 568, the MU is not subject to any writeback conditions, the read recovery operation can end at block 570. In contrast, if, at block 568, the MU is subject to one or more writeback conditions, at block 569, a writeback command can be issued based on the writeback conditions, a writeback operation can be performed to write the MU back to the media, and the read recovery operation can then end at block 570.

In some embodiments, the writeback conditions can be determined based on various criteria, such as whether or not a RAID operation was used to recover data, what the magnitude of the highest discrete read voltage used to recover data was, how many retry attempts (e.g., how many stages of recovery) were used to recover data, an amount of time that has elapsed since a preceding write operation was performed, and/or a type of command that is being processed, among other criteria.

Returning to block 558, if it determined that the BFC for CWs in the MU has been exceeded, at block 559, reads of all the CWs that exceed the BFC threshold can be scheduled. Similarly, if it is determined at block 560 that great than one uncorrectable CW is present in the MU, at block 561, reads for all the CWs that include an error correction code (ECC) failure can be scheduled. Similarly, if it is determined at block 562 that RAID recovery is not enabled for the current stage of the read recovery operation, at block 563, reads of all the CWs that include an ECC failure can be scheduled.

Subsequent to performance of the operations at blocks 559, 561, and/or 563, at block 571, a determination can be made as to whether a stage of the read recovery operation is at a maximum recovery stage. For example, in embodiments in which twelve discrete stages of read recovery can be performed, at block 571 it can be determined if the read recovery operation is at the eleventh and maximum recovery stage. If the read recovery operation has reached the maximum stage, at block 572, an error status for the MU request can be generated indicating that the read recovery operation failed. In some embodiments, at block 573, a status can be collected for each of the CWs of the MU, which can be used to troubleshoot the errors. Finally, at block 574, the read recovery operation can return and a subsequent read recovery operation can be initiated starting with block 551.

If, at block 571 it is determined that the read recovery operation has not yet reached a maximum recovery stage, at block 575 the recovery stage can be incremented, and subsequent stages of the read recovery operation can be performed. For example, at block 576, a read operation involving all the CWs of the MU can be scheduled in order to attempt to recover the data using different parameters than a preceding stage of the read recovery operation. At block 577, if RAID recovery is enabled, a read of the RAID CW can be scheduled to retrieve the RAID CW from the media. Subsequently, at block 578, a determination can be made as to whether there is a pending schedule read operation. If there is not a pending scheduled read operation, the read recovery operation can proceed back to block 557.

In contrast, if there is a pending scheduled read operation, a discrete read voltage associated with performance of an error correction operation on the MU can be performed using a different discrete read voltage at block 579. In some embodiments, the different discrete read voltage used in performance of the error correction operation can be offset from a discrete read voltage used in a previous iteration of the read recovery operation.

At block 580, ECC operations and/or cyclic redundancy check (CRC) operations can be performed on the CWs of the MU that was retrieved at blocks 576 and 577. In some embodiments, the ECC and/or CRC operations can be performed for each CW on each channel of the memory sub-system. Subsequent to performance of the ECC and/or CRC operations, at block 581, the CWs for the MU can be collected in a collection buffer, such as the collection buffer 214 illustrated in FIG. 2. At block 582, a response status can be generated for each CW and sent to the read recovery control circuitry, and the read recovery operation can proceed back to block 556.

Figure 6:
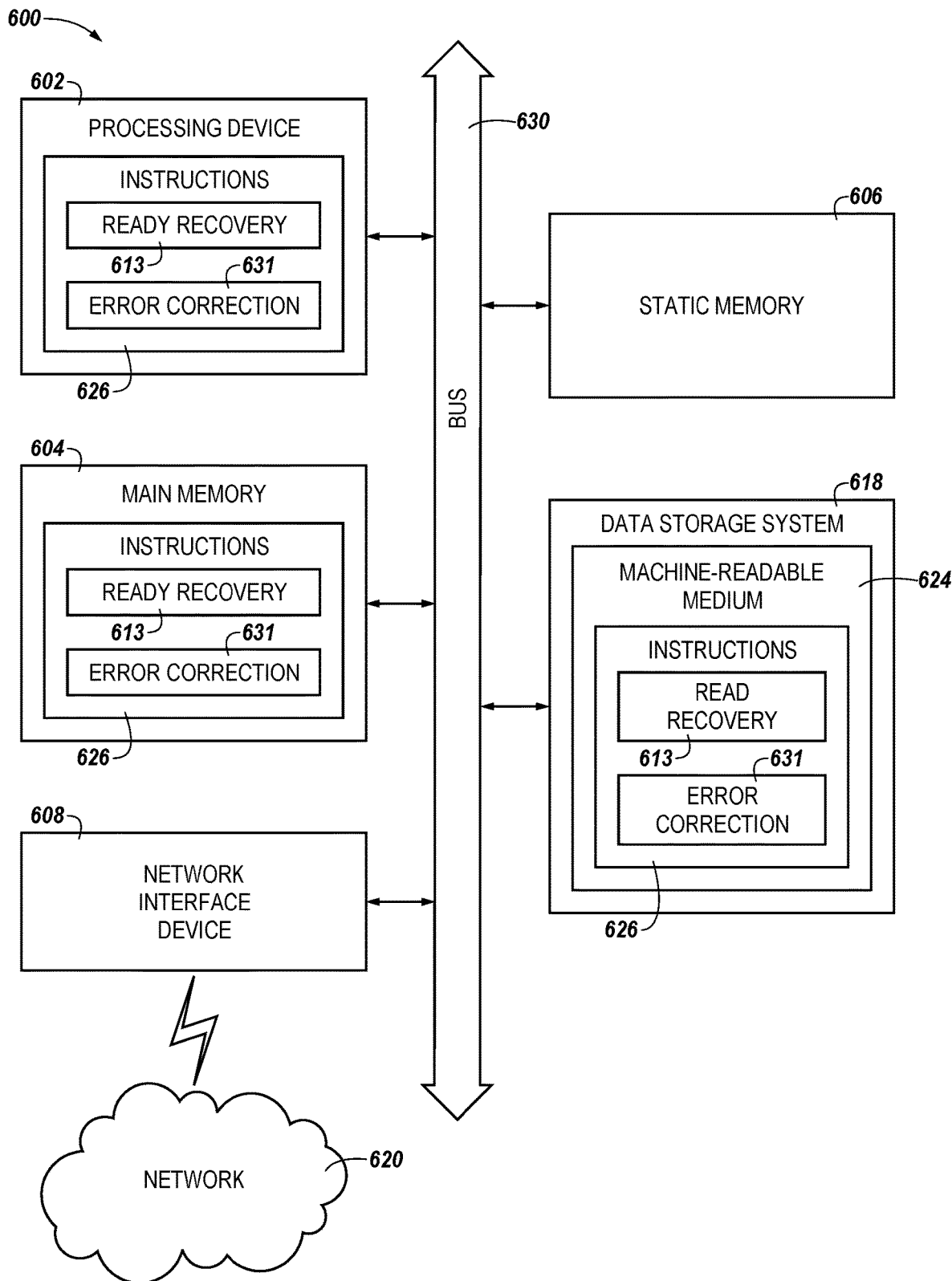
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read recovery control circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 508 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to read recovery control circuitry (e.g., the read recovery control circuitry 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
an error correction component of a plurality of error correction components coupled to read recovery control circuitry, wherein the error correction component is configured to perform one or more initial error correction operations on a plurality of codewords contained within a managed unit received thereto, wherein the plurality of codewords are received from a memory device, and wherein the read recovery control circuitry is configured to:
receive the plurality of error corrected codewords from the error correction component;
determine whether codewords among the plurality of error corrected codewords contain an uncorrectable error;
determine that a redundant array of independent disks (RAID) codeword included in the plurality of error corrected codewords contains the uncorrectable error, wherein the RAID codeword and the plurality of codewords are received by the error correction component at a same time, and wherein the RAID codeword is one of the plurality of codewords;
request that codewords among the plurality of error corrected codewords that contain the uncorrectable error are rewritten to the memory device in response to the determination; and
cause the plurality of error corrected codewords to be transferred to a host coupleable to the read recovery control circuitry.

2. The apparatus of claim 1, wherein the read recovery control circuitry is configured to request that the codewords among the plurality of error corrected codewords that contain the uncorrectable error are rewritten based, at least in part, on information contained in a plurality of register fields accessible by the read recovery control circuitry.

3. The apparatus of claim 1, wherein the read recovery control circuitry is configured to request the codewords among the plurality of error corrected codewords that contain the uncorrectable error are processed by the error correction component according to a particular error code based, at least in part, on a lifecycle stage of a memory device from which the plurality of error corrected codewords are retrieved.

4. The apparatus of claim 1, wherein the read recovery control circuitry is configured to:
determine that a quantity of codewords among the plurality of error corrected codewords that contain the uncorrectable error is less than a threshold quantity of codewords that contain the uncorrectable error; and
perform a logical operation using the plurality of error corrected codewords to recover the codewords that contain the uncorrectable error.

5. The apparatus of claim 1, wherein the read recovery control circuitry is configured to transfer codewords among the plurality of error corrected codewords that do not contain an uncorrectable error to buffering circuitry coupled to the read recovery control circuitry while the request to rewrite the codewords among the plurality of error corrected codewords that contain the uncorrectable error is processed.

6. The apparatus of claim 1, wherein the read recovery control circuitry is configured to cause the error correction component to perform one or more error correction operations on the rewritten codewords using a different discrete read voltage than a discrete read voltage used to perform the one or more initial error correction operations.

7. A method, comprising:
receiving, by read recovery control circuitry, a plurality of codewords that have had an initial error correction operation performed thereon, wherein the plurality of codewords are received from an error correction component of a plurality of error correction components, wherein each of the plurality of error correction components have a one-to-one relationship with a plurality of memory devices;
determining, by the read recovery control circuitry, a quantity of the plurality of error corrected codewords that contain a bit flip error or an uncorrectable error;
determine that a redundant array of independent disks (RAID) codeword included in the plurality of codewords contains the bit flip error or the uncorrectable error, wherein the RAID codeword and the plurality of codewords are received at a same time, and wherein the RAID codeword is one of a plurality of codewords; and
requesting, by the read recovery control circuitry, codewords that contain the bit flip error or the uncorrectable error to be rewritten to a memory device or re-read from the memory device based, at least in part, on recovery stage information accessible by the read recovery control circuitry.

8. The method of claim 7, further comprising requesting the codewords that contain the bit flip error to be re-read using a discrete read voltage greater than a discrete read voltage used to initially read the error corrected codewords.

9. The method of claim 7, further comprising requesting, by the read recovery control circuitry, that the codewords that contain the at least one of the bit flip error or the uncorrectable error, are error corrected using a different error correction criteria than an error correction criteria used to perform the initial error correction operation based, at least in part, on the recovery stage information.

10. The method of claim 9, wherein the error correction criteria comprises a discrete read voltage used in performance of the error correction operation.

11. The method of claim 7, further comprising:
determining, by the read recovery control circuitry that a quantity of codewords among the plurality of initially error corrected codewords that contain the at least one of the bit flip error or the uncorrectable error is less than a threshold quantity of codewords that contain the at least one of the bit flip error or the uncorrectable error; and performing a logical operation using the plurality of error corrected codewords to recover the codewords that contain the at least one of the bit flip error or the uncorrectable error.

12. The method of claim 7, further comprising:

determining, by the read recovery control circuitry, that a single codeword among the plurality of initially error corrected codewords contains the at least one of the bit flip error or the uncorrectable error; and performing a redundant array of independent disks operation to recover the plurality of codewords.

13. The method of claim 7, further comprising:

adapting, by the read recovery control circuitry, the recovery stage information over time based, at least in part, on a wear leveling status of the memory component or a lifecycle stage of the memory component.

14. A system, comprising:

a memory component;

an error correction component of a plurality of error correction components coupled to read recovery control circuitry, and coupled to the memory component and configured to:

perform one or more initial error correction operations on a plurality of codewords received from the memory component, wherein the plurality of codewords includes a redundant array of independent disks (RAID) codeword and wherein the plurality of codewords and the RAID codeword are received at a same time; and transfer the plurality of initially error corrected codewords to the read recovery control circuitry, wherein the read recovery control circuitry is configured to:

determine a quantity of the initially error corrected codewords that contain at least one of a bit flip error or an uncorrectable error that is correctable using a RAID recovery operation and the RAID codeword; and cause a data recovery operation to be performed on the initially error corrected codewords based on the quantity of the initially error corrected codewords that contain the at least one of the bit flip error or the uncorrectable error that is correctable using the RAID recovery operation, and recovery stage information accessible to the read recovery control circuitry.

15. The system of claim 14, wherein the read recovery control circuitry is configured to cause the data recovery operation to be performed by:

requesting that the initially error corrected codewords that contain the at least one of the bit flip error or the uncorrectable error are rewritten from the memory component to the error correction component; and causing the error correction component to perform a second error correction operation on codewords that contain the at least one of the bit flip error or the uncorrectable error that is correctable using the RAID recovery operation.

16. The system of claim 14, wherein the recovery stage information comprises a bit flip count threshold corresponding to the initially error corrected codewords that contain the bit flip error.

17. The system of claim 14, wherein the recovery stage information comprises a wear leveling status of the memory component or a lifecycle stage of the memory component.

18. The system of claim 14, wherein the read recovery control circuitry is configured to:

determine that at least one codeword among the plurality of initially error corrected codewords contains greater than a threshold quantity of bit flip errors; and cause the plurality of initially error corrected codewords to be transferred to the memory component based on the determination.

19. The system of claim 14, further comprising buffering circuitry coupled to the read recovery control circuitry, wherein the read recovery control circuitry is configured to transfer codewords that do not contain the at least one of the bit flip error or the uncorrectable error that is correctable using the RAID recovery operation to the buffering while the request to rewrite the codewords among the plurality of error corrected codewords that contain the at least one of the bit flip error or the uncorrectable error is processed.

20. The system of claim 14, wherein the read recovery control circuitry is configured to cause a data recovery operation to be performed on the initially error corrected codewords based on a data type associated with the initially error corrected codewords.

\* \* \* \* \*